US012389621B2

(12) United States Patent
Cheng

(10) Patent No.: US 12,389,621 B2
(45) Date of Patent: Aug. 12, 2025

(54) SEMICONDUCTOR STRUCTURE WITH DIFFUSION BLOCKING LAYER AND PREPARING METHOD FOR SEMICONDUCTOR STRUCTURE

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

(*) Notice: Subject to any disclaimer, the term of this patent is extended or adjusted under 35 U.S.C. 154(b) by 686 days.

(21) Appl. No.: 17/535,934

(22) Filed: Nov. 26, 2021

(65) Prior Publication Data

US 2022/0085195 A1 Mar. 17, 2022

Related U.S. Application Data

(63) Continuation of application No. PCT/CN2019/090554, filed on Jun. 10, 2019.

(51) Int. Cl.
*H10D 30/47* (2025.01)
*H10D 30/01* (2025.01)
(Continued)

(52) U.S. Cl.
CPC .......... *H10D 30/47* (2025.01); *H10D 30/015* (2025.01); *H10D 30/475* (2025.01); *H10D 62/8503* (2025.01); *H10D 62/854* (2025.01)

(58) Field of Classification Search
None
See application file for complete search history.

(56) References Cited

U.S. PATENT DOCUMENTS 5,448,084 A * 9/1995 Hoke ............... H10D 30/4732
257/E29.32
8,545,629 B2 * 10/2013 Schowalter ............ C30B 25/16
117/952
(Continued)

FOREIGN PATENT DOCUMENTS

CN 1698212 A 11/2005
CN 101027791 A * 8/2007 ............ H01L 33/02
(Continued)

OTHER PUBLICATIONS

International Search Report issued in corresponding PCT Application No. PCT/CN2019/090554, dated Mar. 3, 2020.
(Continued)

*Primary Examiner* — Scott B Geyer
(74) *Attorney, Agent, or Firm* — Westbridge IP LLC

(57) ABSTRACT

Disclosed are a semiconductor structure and a preparing method for a semiconductor structure, which relate to the technical field of microelectronics. The semiconductor structure includes a buffer layer including a diffusion element; a diffusion blocking layer formed on the buffer layer, the diffusion blocking layer including an adsorptive element; and a channel layer formed on the diffusion blocking layer. In this embodiment, the diffusion blocking layer is provided with an adsorptive element that adsorbs the diffusion element, so as to effectively block the diffusion of the diffusion element to the channel layer from the buffer layer. In addition, a change in the composition of the adsorptive element in the diffusion blocking layer is provided to avoid stress release of the diffusion blocking layer.

18 Claims, 5 Drawing Sheets

(51) Int. Cl.
*H10D 62/85* (2025.01)
*H10D 62/854* (2025.01)

(56) References Cited

U.S. PATENT DOCUMENTS

| | | | | |
|---|---|---|---|---|
| 9,076,812 | B2* | 7/2015 | Laboutin | H01L 29/7786 |
| 9,627,489 | B2* | 4/2017 | Hung | H10D 62/357 |
| 2004/0169194 | A1* | 9/2004 | Noda | H10D 30/4738 |
| | | | | 257/190 |
| 2005/0173728 | A1* | 8/2005 | Saxler | H01L 29/2003 |
| | | | | 257/E29.093 |
| 2007/0252135 | A1* | 11/2007 | Lee | H10H 20/825 |
| | | | | 257/E33.001 |
| 2008/0093610 | A1* | 4/2008 | Lee | H10H 20/825 |
| | | | | 257/94 |
| 2008/0157058 | A1* | 7/2008 | Hudait | H01L 21/0251 |
| | | | | 257/14 |
| 2008/0182369 | A1* | 7/2008 | Jeong | H10D 30/015 |
| | | | | 257/E29.127 |
| 2008/0203430 | A1* | 8/2008 | Simin | H01L 29/7783 |
| | | | | 257/192 |
| 2008/0258135 | A1* | 10/2008 | Hoke | H10D 62/852 |
| | | | | 257/E29.069 |
| 2009/0045438 | A1* | 2/2009 | Inoue | H01L 29/155 |
| | | | | 257/E29.091 |
| 2009/0072220 | A1* | 3/2009 | Lee | H10H 20/83 |
| | | | | 257/E21.085 |
| 2010/0012987 | A1* | 1/2010 | Yeh | G01N 27/414 |
| | | | | 257/253 |
| 2010/0117118 | A1* | 5/2010 | Dabiran | H01L 29/7787 |
| | | | | 257/190 |
| 2010/0270591 | A1* | 10/2010 | Ahn | H01L 29/7782 |
| | | | | 257/E21.403 |
| 2011/0027974 | A1* | 2/2011 | Su | H01L 21/0262 |
| | | | | 257/E21.09 |
| 2011/0064103 | A1* | 3/2011 | Ohta | H01L 21/0254 |
| | | | | 372/45.01 |
| 2013/0113018 | A1* | 5/2013 | Wakita | H01L 29/205 |
| | | | | 257/190 |
| 2013/0189817 | A1* | 7/2013 | Peroni | H01L 29/42316 |
| | | | | 438/172 |
| 2013/0316507 | A1* | 11/2013 | Saitoh | H10D 62/8503 |
| | | | | 438/285 |
| 2015/0017789 | A1* | 1/2015 | Hashimoto | H10D 30/871 |
| | | | | 438/503 |
| 2015/0041825 | A1 | 2/2015 | Liu et al. | |
| 2016/0336314 | A1* | 11/2016 | Chou | H10D 62/343 |
| 2017/0125573 | A1* | 5/2017 | Lin | H01L 29/0619 |
| 2018/0069086 | A1* | 3/2018 | Ishiguro | H10D 30/015 |
| 2019/0020318 | A1* | 1/2019 | Ishiguro | H01L 21/0254 |
| 2020/0135445 | A1* | 4/2020 | Yamazaki | H10D 87/00 |
| 2021/0183649 | A1* | 6/2021 | Dahl | H01L 21/02458 |

FOREIGN PATENT DOCUMENTS

| | | | | |
|---|---|---|---|---|
| CN | 101390201 | A | | 3/2009 |
| CN | 101789446 | A | | 7/2010 |
| CN | 102265474 | A * | 11/2011 | ............ B82Y 20/00 |
| CN | 102931229 | A | | 2/2013 |
| CN | 103107190 | A * | 5/2013 | ........... H01L 29/778 |
| CN | 104600109 | A | | 5/2015 |
| CN | 106887494 | A | | 6/2017 |
| CN | 107146832 | A * | 9/2017 | ........... H01L 33/007 |
| CN | 108140563 | A * | 6/2018 | ............ C23C 16/303 |
| CN | 108511522 | A * | 9/2018 | ........... H01L 29/267 |
| CN | 108807527 | A * | 11/2018 | ........ H01L 21/8252 |
| CN | 109638074 | A * | 4/2019 | ........ H01L 29/0603 |
| CN | 109671815 | A | | 4/2019 |
| GB | 2358736 | A * | 8/2001 | ....... H01L 21/02395 |
| JP | 2009026975 | A * | 2/2009 | ........... H01L 21/338 |
| JP | 2015122482 | A * | 7/2015 | ........... H01L 21/338 |
| WO | WO-0007248 | A1 * | 2/2000 | ....... H01L 21/28587 |
| WO | WO-0191188 | A2 * | 11/2001 | ....... H01L 21/28587 |
| WO | 2018180021 | A1 | | 10/2018 |
| WO | 2019097963 | A1 | | 5/2019 |

OTHER PUBLICATIONS

Written Opinion issued in corresponding PCT Application No. PCT/CN2019/090554, dated Mar. 3, 2020.

* cited by examiner

SEMICONDUCTOR STRUCTURE WITH DIFFUSION BLOCKING LAYER AND PREPARING METHOD FOR SEMICONDUCTOR STRUCTURE

CROSS-REFERENCE TO RELATED APPLICATIONS

This application is a continuation of International Application No. PCT/CN2019/090554, filed on Jun. 10, 2019, the entire contents of which are incorporated herein by reference.

TECHNICAL FIELD

Embodiments of this application relates to the field of microelectronics technology, in particular to a semiconductor structure and a preparing method for a semiconductor structure.

BACKGROUND

Currently, epitaxy is often used in the semiconductor industry. For example, a chemical vapor deposition (CVD) method is often used as an epitaxial method to form an epitaxial layer on a substrate. During the growth process, the epitaxial layer can be doped with impurities to control the electrical properties of the layer. For example, Be, Mg, C, Fe, and the like are commonly used as acceptor dopants in nitride semiconductor layers. However, among these elements, the use of Mg, Fe, etc. can cause the problem of "memory effect", thereby adversely affecting the performance of the semiconductor devices.

SUMMARY

In view of this, the present application provides a semiconductor structure and a preparing method for a semiconductor structure to avoid the memory effect of diffused element in the prior art.

One aspect of the present application provides a semiconductor structure, including: a buffer layer, the buffer layer including a diffusion element; a diffusion blocking layer formed on the buffer layer, the diffusion blocking layer including an adsorptive element; and a channel layer on the diffusion blocking layer.

In an embodiment of the present application, the diffusion element in the buffer layer includes a metal element.

In an embodiment of the present application, the material used for the diffusion blocking layer includes a group III-V compound, and a group III element in the group III-V compound may be the adsorptive element.

In an embodiment of the present application, the III-V compound includes a compound of In.

In an embodiment of the present application, the compound of In includes InGaN.

In an embodiment of the present application, the compound of In includes AlInGaN, wherein an Al composition is less than an In composition.

In an embodiment of the present application, a composition of the adsorptive element in the diffusion blocking layer decreases along an epitaxial direction of the diffusion blocking layer.

Another aspect of the present application provides a preparing method for a semiconductor structure, including: forming a buffer layer including a diffusion element; forming a diffusion blocking layer on the buffer layer, the diffusion blocking layer including an adsorptive element; forming a channel layer on the diffusion blocking layer.

In an embodiment of the present application, the diffusion blocking layer includes a III-V compound, and a group III element in the III-V compound is the adsorptive element.

In an embodiment of the present application, the III-V compound includes a compound of In.

In an embodiment of the present application, the compound of In includes InGaN.

In an embodiment of the present application, the compound of In includes AlInGaN, wherein an Al composition is less than an In composition.

In an embodiment of the present application, a composition of the adsorptive element in the diffusion blocking layer decreases, along an epitaxial direction of the diffusion blocking layer.

In an embodiment of the present application, the diffusion element includes a metal element.

In an embodiment of the present application, a formation temperature of the diffusion blocking layer does not exceed 900° C.

In the embodiments, the diffusion blocking layer is provided with an adsorptive element that adsorbs the diffusion element, thereby effectively blocking the diffusion of the diffusion element to the channel layer from the buffer layer. In addition, the stress release of the diffusion blocking layer is avoided by setting the composition change of the adsorptive element in the diffusion blocking layer.

BRIEF DESCRIPTION OF DRAWINGS

In order to explain the technical solutions of the embodiments of the present application more clearly, the following will briefly introduce the drawings that need to be used in the embodiments. It should be understood that the following drawings only show certain embodiments of the present application, and therefore they should not be regarded as a limitation of the scope. For those of ordinary skill in the art, other related drawings can be obtained from these drawings without creative work.

DETAILED DESCRIPTION OF THE EMBODIMENTS

Figure 1:
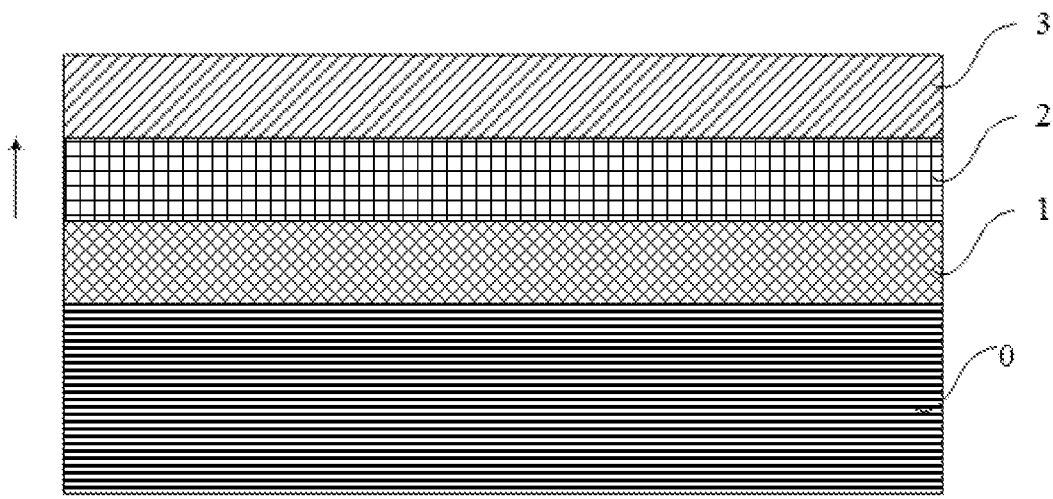
FIG. 1 is a schematic structural diagram of a semiconductor structure according to an embodiment of the present application.

With reference to the drawings in the embodiments of the present application, the technical solutions in the embodiments of the present application are clearly and completely described as follows. Apparently, the described embodiments are only a part of the embodiments of the present application, rather than all the embodiments. Based on the embodiments in this application, all other embodiments obtained by those of ordinary skill in the art without creative work shall fall within the protection scope of this application.

Where possible, the same or similar parts in the drawings have the same reference signs.

FIG. 1 is a schematic structural diagram of a semiconductor structure according to an embodiment of the present application, and the arrow direction in the figure is the epitaxial direction of the semiconductor structure.

As shown in FIG. 1, the semiconductor structure includes a buffer layer 1, a diffusion blocking layer 2 and a channel layer 3. The buffer layer 1 includes a diffusion element. The diffusion blocking layer 2 is formed on the buffer layer 1, and includes an adsorptive element for preventing diffusion of the diffusion element. The channel layer 3 is formed on the diffusion blocking layer 2.

In this embodiment, the semiconductor structure also includes a substrate 0, and the buffer layer 1 may be formed on the substrate 0.

Specifically, the diffusion element in the buffer layer 1 may be realized by intentional doping or may be inevitable in the epitaxial growth environment of the semiconductor structure. The diffusion element may include a metal element, for example, Fe, Mg, and the like. It is understandable that intentional doping of a diffusion element in the buffer layer 1 can increase the electric resistivity of the buffer layer 1 and effectively increase the breakdown voltage of the semiconductor structure. However, a diffusion element generally has memory effect problems, that is, even if the doping of the diffusion element has been stopped during the growth of the buffer layer 1, the diffusion element may still diffuse into the channel layer 3, affecting the performance of the entire semiconductor device. Therefore, the diffusion blocking layer 2 is arranged to effectively block the diffusion element from diffusing to the channel layer 3 from the buffer layer 1.

Further, the diffusion blocking layer 2 includes an adsorptive element, and the composition of the adsorptive element in the diffusion blocking layer 2 varies, specifically, in the direction from the buffer layer 1 to the channel layer 3, i.e., in the direction of semiconductor epitaxial growth, the composition of the adsorptive element in the diffusion blocking layer 2 decreases.

Further, the diffusion blocking layer 2 may include a III-V compound, where the group III element may be used as an adsorptive element. For example, the III-V compound may include a compound of In, and the compound of In may include $In_xGa_yN$, where x+y=1.

In the diffusion blocking layer 2 composed of $In_xGa_yN$, In in $In_xGa_yN$ may be an adsorptive element, and the composition of In in $In_xGa_yN$ decreases along the epitaxial growth direction, where the composition variation range of In is $0<x\leq1$.

Specifically, during the epitaxial growth of the diffusion blocking layer 2 composed of $In_xGa_yN$, the aforementioned In composition gradation can be realized by adjusting the growth temperature or the ratio of the indium source and the gallium source. For example, for the method of adjusting the growth temperature, the growth temperature may not exceed 900° C. Further, it may not exceed 850° C.

In other embodiments, the diffusion blocking layer 2 may also be $Al_zIn_xGa_yN$, where x+y+z=1, and the composition of Al is less than that of In, i.e. z<x, to ensure that the lattice constant of AlInGaN matches GaN better, thereby improving the quality of epitaxial growth.

Further, the buffer layer 1 and the channel layer 3 include a nitride semiconductor layer, for example, a GaN-based material. The so-called GaN-based material is a semiconductor material that includes at least Ga atoms and N atoms, such as GaN, AlGaN, InGaN, AlInGaN, etc.

Specifically, when the buffer layer 1 includes GaN and the diffusion blocking layer 2 includes InGaN, since the thermal mismatch and lattice mismatch between GaN and InGaN are relatively large, the diffusion blocking layer 2 will experience stress release, resulting in decreased quality of the semiconductor structure. By adjusting the In composition of InGaN in the diffusion blocking layer 2, it is equivalent to multiple InGaN diffusion blocking layers 2 with different compositions, which can effectively avoid the stress release of the diffusion blocking layer 2.

In this embodiment, the diffusion blocking layer 2 is provided with an adsorptive element that adsorbs the diffusion element, so as to effectively block the diffusion of the diffusion element from the buffer layer 1 to the channel layer 3. In addition, the stress release of the diffusion blocking layer 2 is avoided by setting changes in the composition of the adsorptive elements in the diffusion blocking layer 2.

FIG. 2 to FIG. 5 are schematic diagrams of the composition changes of the adsorptive elements in the diffusion blocking layer 2 according to an embodiment of the present application, respectively. The ordinate represents the component content of the adsorptive element in the diffusion blocking layer 2, and the abscissa represents the epitaxial direction. It can be seen from FIG. 2 to FIG. 5 that the composition content of the adsorptive element in the diffusion blocking layer 2 decreases along the epitaxial direction.

Figure 2:
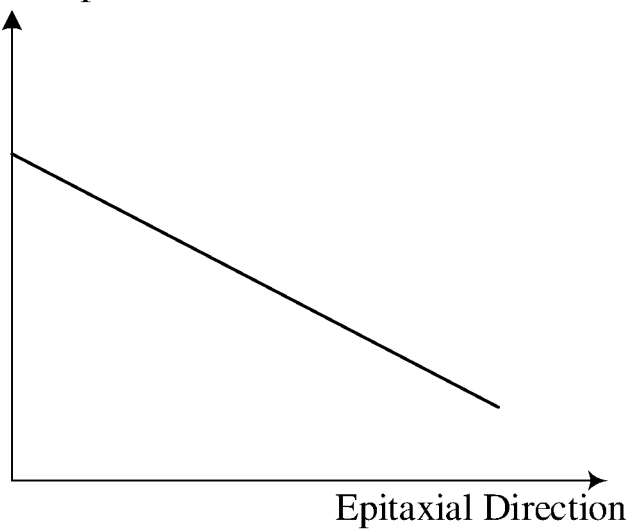
FIG. 2 to FIG. 5 are schematic diagrams of the composition changes of the adsorptive element in the diffusion blocking layer according to an embodiment of the present application, respectively.
Figure 5:
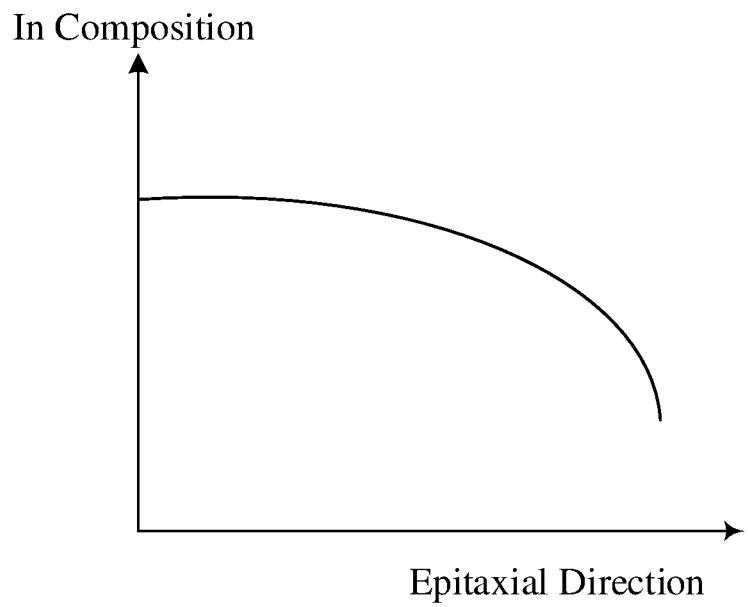

Specifically, in an embodiment of the present application, as shown in FIG. 2 and FIG. 5, the composition content of the adsorptive element in the diffusion blocking layer 2 decreases along the epitaxial direction of the diffusion blocking layer 2. Under such changes in the adsorptive element, a relatively flat quantum well structure can be realized.

Figure 3:
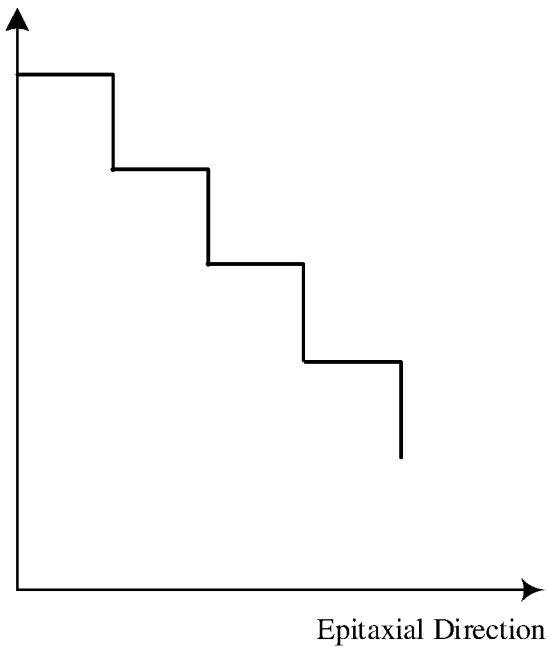
Figure 4:
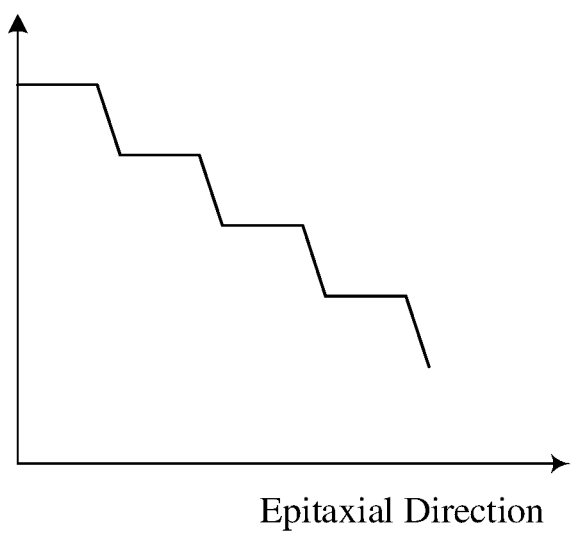

Or, as shown in FIG. 3 and FIG. 4, the adsorptive element may gradually decrease in a stepwise manner along the epitaxial direction of the diffusion blocking layer 2. Under such changes in the adsorptive element, a multi-channel effect can be obtained, thereby reducing the spatial concentration of two-dimensional electron gas (2DEG) and increasing the mobility rate of carriers.

Here, the epitaxial direction of the diffusion blocking layer 2 may refer to the epitaxial growth direction of the diffusion blocking layer 2 during preparation. When the diffusion blocking layer 2 includes $In_xGa_yN$, the In component may be an adsorptive element. Along the epitaxial direction of the diffusion blocking layer 2, the In composition may decrease or reduce in a stepwise manner, that is, the X value decreases or reduces in a stepwise manner.

Specifically, as shown in FIG. 2 to FIG. 5, along the epitaxial direction of the diffusion blocking layer 2, the adsorptive element composition in the diffusion blocking layer 2, such as the In composition content, decreases in the direction of epitaxial growth. The content of the In component may reduce linearly, as shown in FIG. 2; it may also reduce non-linearly, as shown in FIG. 5. The content of the In component may reduce in a stepwise period, as shown in FIG. 3 to FIG. 4; it may also reduce in other non-periodical manners. In this case, the manner in which the component of the adsorptive element decreases along the epitaxial growth direction is not limited, as long as the component of the adsorptive element in the diffusion blocking layer 2 shows a decreasing trend along the epitaxial growth direction.

The semiconductor structure according to an embodiment of the present application is described above, and a preparing method for a semiconductor structure according to an embodiment of the present application is described below with reference to FIG. 6.

Figure 6:
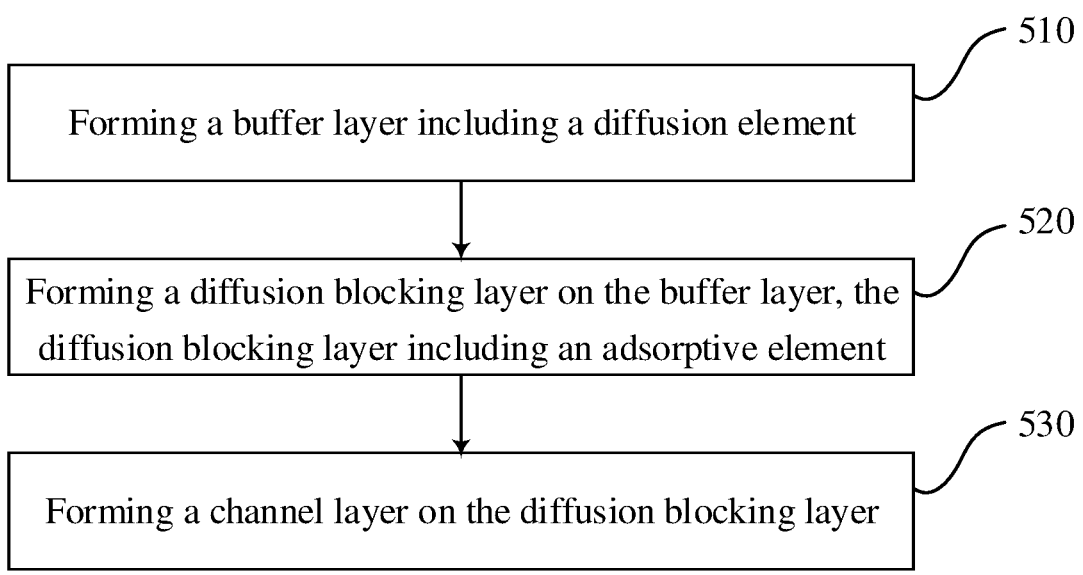
FIG. 6 is a schematic flowchart of a preparing method for a semiconductor structure according to an embodiment of the present application.

FIG. 6 is a schematic flowchart of a preparing method for a semiconductor structure according to an embodiment of the present application.

As shown in FIG. 6, the preparing method for a semiconductor structure may include the following steps.

Step 510, preparing a buffer layer 1 including a diffusion element.

Specifically, the diffusion element in the buffer layer 1 may be realized by intentional doping or may be inevitable in the epitaxial growth environment of the semiconductor structure. The diffusion element may include a metal element, for example, Fe, Mg, and the like. It is understandable that intentional doping of a diffusion element in the buffer layer 1 can increase the electric resistivity of the buffer layer 1 and effectively increase the breakdown voltage of the semiconductor structure. However, a diffusion element generally has memory effect problems, that is, even if the doping of the diffusion elements has been stopped during the growth of the buffer layer 1, the diffusion elements may still diffuse into the channel layer 3, affecting the performance of the entire semiconductor device. Therefore, the diffusion blocking layer 2 is arranged to effectively block the diffusion elements from diffusing to the channel layer 3 from the buffer layer 1.

Step 520, preparing a diffusion blocking layer 2 on the buffer layer 1, where the diffusion blocking layer 2 includes an adsorptive element.

Further, the diffusion blocking layer 2 includes an adsorptive element, and the composition of the adsorptive element in the diffusion blocking layer 2 varies, specifically, in the direction from the buffer layer 1 to the channel layer 3, i.e., in the direction of semiconductor epitaxial growth, the composition of the adsorptive element in the diffusion blocking layer 2 decreases.

In this embodiment, the epitaxial direction of the diffusion blocking layer 2 may refer to the epitaxial growth direction of the diffusion blocking layer 2 during preparation. When the diffusion blocking layer 2 is $In_xGa_yN$, the In component may be an adsorptive element. Along the epitaxial direction of the diffusion blocking layer 2, the In composition can be reduced or stepped down, that is, the X value decrease or reduce in a stepwise manner. A relatively flat quantum well structure can be achieved, and an effect of a multi-channel structure can be obtained, thereby reducing the spatial concentration of two-dimensional electron gas (2DEG) and increasing the mobility rate of carriers.

Further, the diffusion blocking layer 2 may include a III-V compound, where the group III element may be used as an adsorptive element. For example, the III-V compound may include a compound of In, and the compound of In may include $In_xGa_yN$, where x+y=1.

In the diffusion blocking layer 2 composed of $In_xGa_yN$, In in $In_xGa_yN$ may be an adsorptive element, and the composition of In in $In_xGa_yN$ decreases along the epitaxial growth direction, where the composition variation range of In is $0<x\leq1$.

Specifically, during the epitaxial growth of the diffusion blocking layer 2 composed of $In_xGa_yN$, the aforementioned In composition gradation can be realized by adjusting the growth temperature or the ratio of the indium source and the gallium source. For example, for the method of adjusting the growth temperature, the growth temperature may be limited to not more than 900° C. Further, it may not exceed 850° C.

Step 530, preparing a channel layer 3 on the diffusion blocking layer 2.

Further, the buffer layer 1 and the channel layer 3 include a nitride semiconductor layer, for example, a GaN-based material. The so-called GaN-based material is a semiconductor material that includes at least Ga atoms and N atoms, such as GaN, AlGaN, InGaN, AlInGaN, etc.

Specifically, when the buffer layer 1 includes GaN and the diffusion blocking layer 2 includes InGaN, since the thermal mismatch and lattice mismatch between GaN and InGaN are relatively large, resulting in stress release of the diffusion blocking layer 2, resulting in decreased quality of the semiconductor structure. By adjusting the In composition of InGaN in the diffusion blocking layer 2, it is equivalent to multiple InGaN diffusion blocking layers 2 with different compositions, which can effectively avoid the stress release of the diffusion blocking layer 2.

In this embodiment, the diffusion blocking layer 2 is provided with an adsorptive element that adsorbs the diffusion element, so as to effectively block the diffusion of the diffusion element from the buffer layer 1 to the channel layer 3. In addition, the stress release of the diffusion blocking layer 2 is avoided by setting changes in the composition of the adsorptive elements in the diffusion blocking layer 2.

Figure 7:
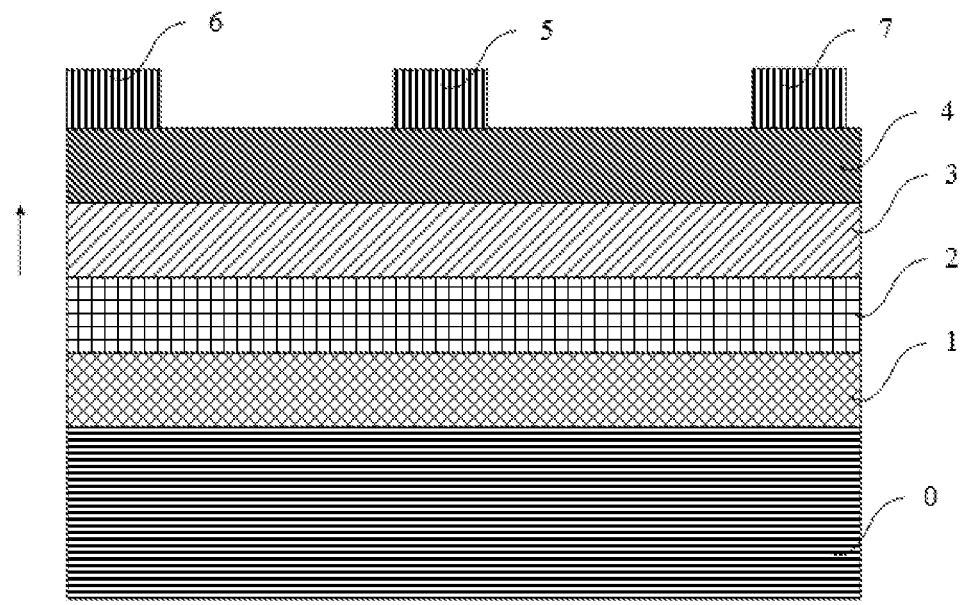
FIG. 7 illustrates a high electron mobility transistor (HEMT) semiconductor device formed by a semiconductor structure.

Further, when the semiconductor structure forms a semiconductor device such as an HEMT, as shown in FIG. 7, it includes a substrate 0, the buffer layer 1 formed on the substrate 0, the diffusion blocking layer 2 formed on the buffer layer 1, and the channel layer on the diffusion blocking layer 2, a barrier layer 4 formed on the channel layer 3, and a gate electrode 5, a source electrode 6 and a drain electrode 7 formed on the barrier layer 4.

In this embodiment, the substrate 0 may include Si, SiC, sapphire, etc. The buffer layer 1 may include a metal element, for example, Fe, Mg, etc. The diffusion blocking layer 2 may include InGaN, where In is an adsorptive element that is used to block the metal element in the buffer layer 1 from diffusing to the channel layer 3 and affecting the performance of the device. The channel layer 3 can include GaN, and the barrier layer 4 can include AlGaN. The channel layer 3 just needs to form a heterojunction with the barrier layer 4, and a quantum well is formed at its interface to confine the carriers in the quantum well to form a two-dimensional electron gas channel.

Figure 8:
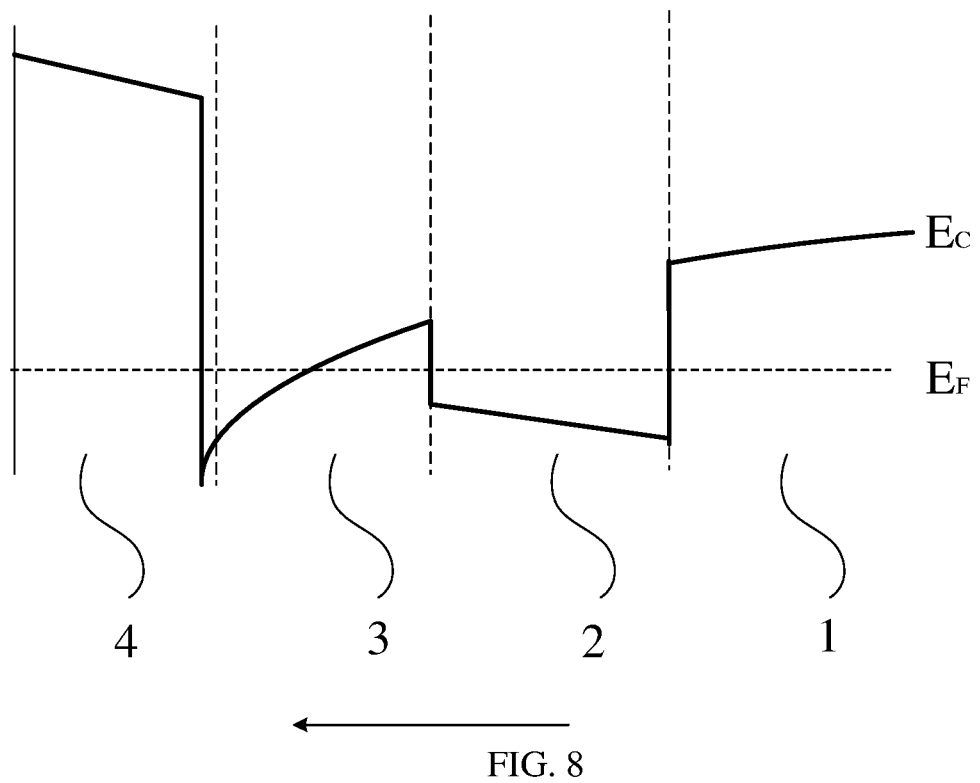
FIG. 8 and FIG. 9 are energy band structure diagrams of corresponding semiconductor devices.
Figure 9:
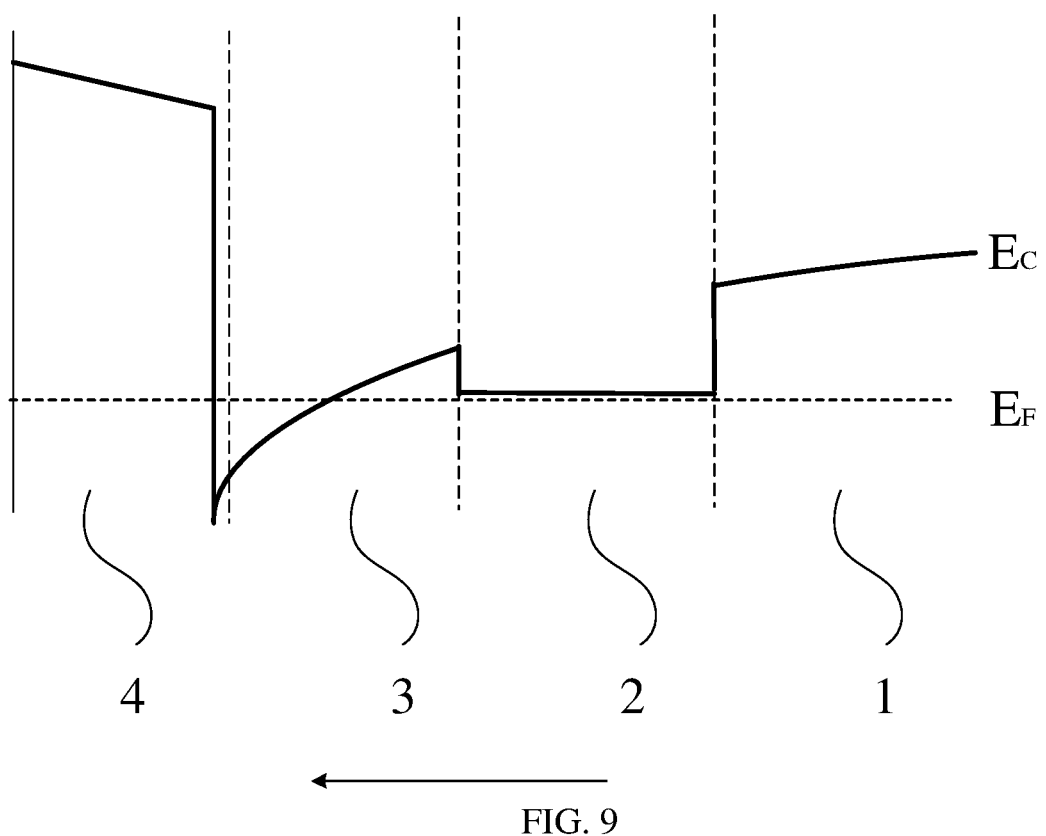

FIG. 8 and FIG. 9 are energy band structure diagrams of corresponding semiconductor devices. FIG. 8 corresponds to the situation in which the adsorptive element In composition in the diffusion blocking layer 2 becomes smaller along the direction of the epitaxial layer. FIG. 9 corresponds to the situation in which the composition of the adsorptive element In in the diffusion blocking layer 2 remains unchanged.

The diffusion blocking layer 2 is provided with an adsorptive element that adsorbs the diffusion element, thereby effectively blocking the diffusion of the diffusion element to the channel layer 3 from the buffer layer 1. In addition, the stress release of the diffusion blocking layer 2 is avoided by setting changes in the composition of the adsorptive element in the diffusion blocking layer 2.

The above are only preferred embodiments of the present application and are not used to limit the protection scope of the present application. Any modification, equivalent replacement, improvement, etc. made within the spirit and principle of this application shall be included in the protection scope of this application.

What is claimed is:

1. A semiconductor structure, including:
   a buffer layer including a diffusion element;
   a diffusion blocking layer formed on the buffer layer, the diffusion blocking layer including an adsorptive element; and
   a channel layer formed on the diffusion blocking layer;
   wherein a composition of the adsorptive element in the diffusion blocking layer decreases along an epitaxial growth direction of the diffusion blocking layer.

2. The semiconductor structure according to claim 1, wherein the diffusion blocking layer includes a III-V compound, and a group III element in the III-V compound is the adsorptive element.

3. The semiconductor structure according to claim 2, wherein the III-V compound includes a compound of In.

4. The semiconductor structure according to claim 3, wherein the compound of In includes InGaN.

5. The semiconductor structure according to claim 3, wherein the compound of In includes AlInGaN, and an Al composition is less than an In composition.

6. The semiconductor structure according to claim 1, wherein the composition of the adsorptive element in the diffusion blocking layer decreases in a stepwise period along the epitaxial growth direction of the diffusion blocking layer.

7. The semiconductor structure according to claim 1, wherein the composition of the adsorptive element in the diffusion blocking layer decreases in a non-periodical manner along the epitaxial growth direction of the diffusion blocking layer.

8. The semiconductor structure according to claim 1, wherein the composition of the adsorptive element in the diffusion blocking layer decreases linearly or non-linearly along the epitaxial growth direction of the diffusion blocking layer.

9. The semiconductor structure according to claim 1, wherein the diffusion element includes a metal element.

10. A preparing method for a semiconductor structure, comprising:
    forming a buffer layer including a diffusion element;
    forming a diffusion blocking layer on the buffer layer, the diffusion blocking layer including an adsorptive element; and
    forming a channel layer on the diffusion blocking layer;
    wherein a composition of the adsorptive element in the diffusion blocking layer decreases along an epitaxial growth direction of the diffusion blocking layer.

11. The method according to claim 10, wherein the diffusion blocking layer includes a III-V compound, and a group III element in the III-V compound is the adsorptive element.

12. The method according to claim 11, wherein the III-V compound includes a compound of In.

13. The method according to claim 12, wherein the compound of In includes InGaN.

14. The method according to claim 12, wherein the In compound comprises AlInGaN, and an Al composition is less than an In composition.

15. The method according to claim 10, wherein the composition of the adsorptive element in the diffusion blocking layer decreases in a stepwise period or in a non-periodical manner along the epitaxial growth direction of the diffusion blocking layer.

16. The method according to claim 10, wherein the composition of the adsorptive element in the diffusion blocking layer decreases linearly or non-linearly along the epitaxial growth direction of the diffusion blocking layer.

17. The method according to claim 10, wherein the diffusion element includes a metal element.

18. The method according to claim 10, wherein a formation temperature of the diffusion blocking layer does not exceed 900° C.

* * * * *